United States Patent [19]

Lebailly et al.

[11] Patent Number: 4,568,796
[45] Date of Patent: Feb. 4, 1986

[54] HOUSING CARRIER FOR INTEGRATED CIRCUIT

[75] Inventors: Michel Lebailly, Bollene; Bernard Lacruche, Chelles, both of France

[73] Assignee: LCC.CICE-Compagnie Europenne de Composants Electroniques, Paris, France

[21] Appl. No.: 566,736

[22] Filed: Dec. 29, 1983

[30] Foreign Application Priority Data

Dec. 30, 1982 [FR] France ................. 82 22069

[51] Int. Cl.⁴ .............................................. H05K 5/04
[52] U.S. Cl. .............................. 174/52 R; 174/52 FP; 339/17 CF; 361/395; 361/415
[58] Field of Search ............... 174/52 FP, 35 C, 35 R, 174/50.56, 50.61, 50.64, 52 R; 361/414, 415, 399; 339/17 CF

[56] References Cited

U.S. PATENT DOCUMENTS

| | | | |
|---|---|---|---|
| 3,185,761 | 5/1965 | McHugh | 361/414 X |
| 3,228,091 | 1/1966 | Rice et al. | 361/414 X |
| 3,416,348 | 12/1968 | Carter et al. | 174/52 FP |
| 3,550,766 | 12/1970 | Nixen | 174/52 FP X |
| 3,650,232 | 3/1972 | Heinlen | 174/52 FP X |
| 3,735,214 | 5/1973 | Renskers et al. | 174/52 FP X |
| 4,089,575 | 5/1978 | Grabbe | 174/52 FP X |
| 4,147,889 | 4/1979 | Andrews et al. | 174/52 FP |
| 4,224,637 | 9/1980 | Hargis | 174/52 FP X |
| 4,463,217 | 7/1984 | Orcutt | 174/52 FP |

OTHER PUBLICATIONS

Electronique Industrielle, No. 31, Apr. 1982, pp. 105-114, Paris.
Patents Abstracts of Japan, vol. 6, No. 211(E-137)[1089], Oct. 23, 1982; & JP-A-57 115 850 (Nippon Denki K.K.) (19-07-1982).

Primary Examiner—R. R. Kucia
Attorney, Agent, or Firm—Oblon, Fisher, Spivak, McClelland & Maier

[57] ABSTRACT

The present invention concerns a housing carrier for an integrated circuit.

It comprises at least two rows of output conductors disposed at regular intervals on the periphery of a housing along a given pitch, these conductors presenting end parts extending from the housing with a view to electrically connecting the housing on an utilization circuit, and wherein the rows are staggered with respect to one another.

5 Claims, 17 Drawing Figures

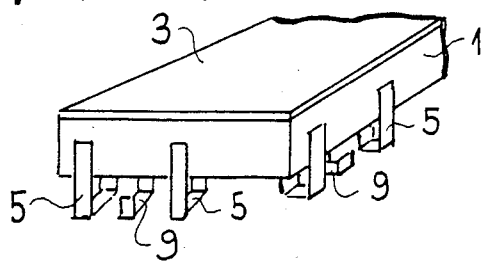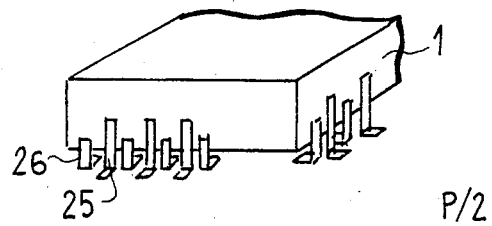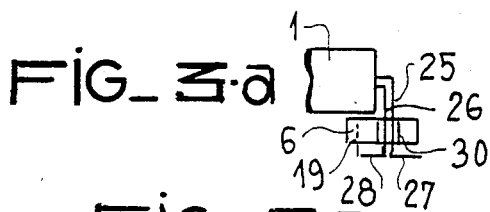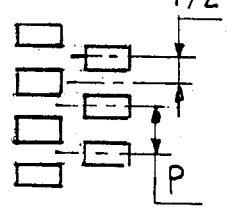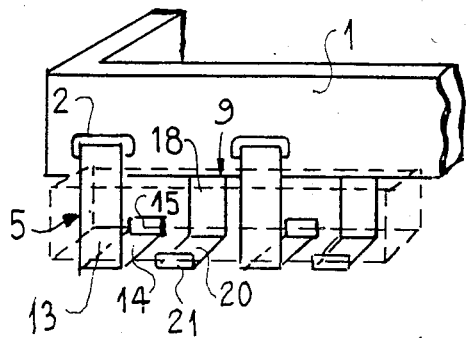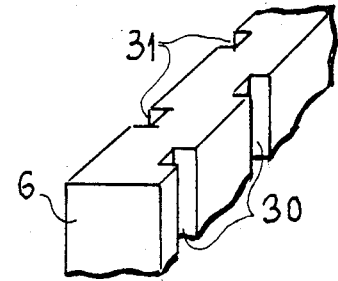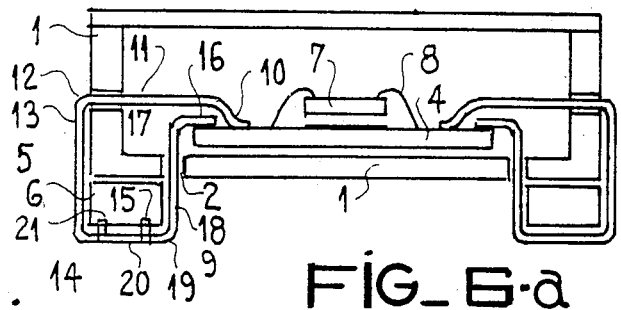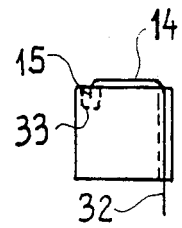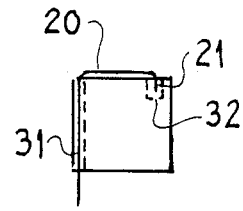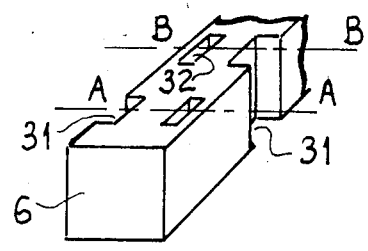

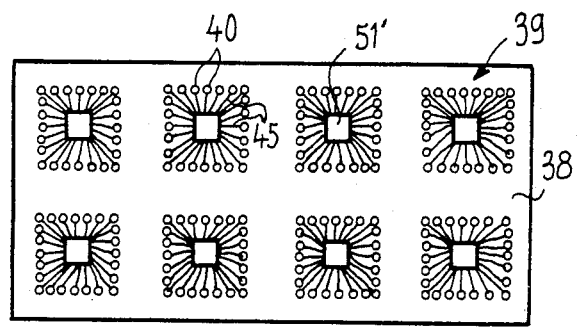
FIG_7-a
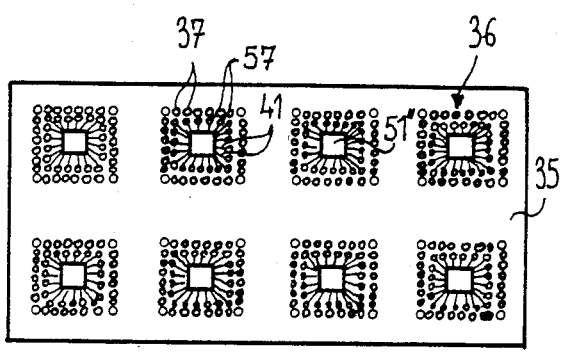
FIG_7-b
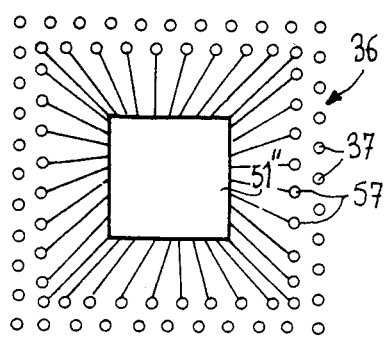
FIG_7-c
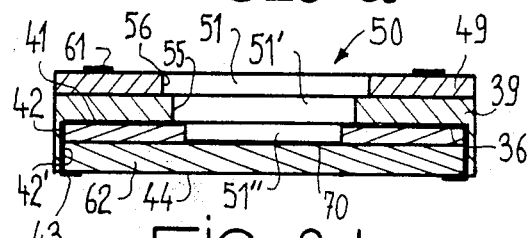
FIG_8-a
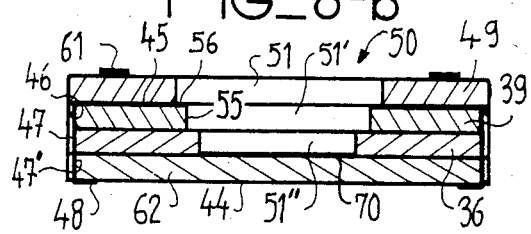
FIG_8-b
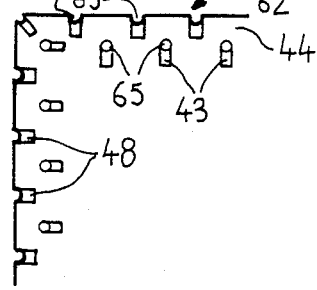
FIG_8-c
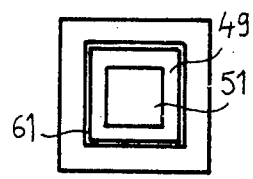
FIG_8-d

HOUSING CARRIER FOR INTEGRATED CIRCUIT

TECHNICAL FIELD

The present invention concerns a housing carrier for an integrated circuit.

BACKGROUND OF THE INVENTION

From the prior art are already known housing carrier comprising output conductors organized to form a row with a given pitch, which according to currently used technologies, cannot in practice be smaller than 1.27 mm. However, the evolution of integrated circuits and their increasingly frequent use in the form of hybrid circuits lead to the result that the number of output conductors available on each housing must be greater and greater.

SUMMARY OF THE INVENTION

The present invention concerns a housing carrier for an integrated circuit allows the number of output conductors available on each housing to be increased.

With this purpose, the present invention comprises n (with n greater than or equal to 2) rows of output conductors arranged at regular intervals on the periphery of a housing, forming a given pitch, these conductors presenting end portions extending beyond the housing to allow the electric connection of the housing on a utilization circuit wherein the rows are staggered with respect to one another by $1/n$th pitch.

According to one embodiment of the invention, two rows forming an upper and a lower row are disposed on at least one lateral face of the housing. The end portions of the output conductors of one of the rows can be folded over towards the housing carrier and those of the other rows towards the outside of the base-plate. For example, the end portions of the output conductors of the upper row are folded over towards the housing carrier.

According to another embodiment of the invention, at least one row is disposed on at least one lateral face of the housing and at least one other row on the edge of the lower face of the housing which is contiguous to the said lateral face. The end portions of the output conductors of the row disposed on the lateral face of the housing can be folded over towards the housing and those of the output conductors of the row disposed on the lower face of the housing can be folded over towards the outside of the housing.

According to a further embodiment of the invention, the housing carrier comprises two rows of output conductors disposed on the lower face of the housing. Thus the base-plate can be made of ceramic material and is distinguishing more particularly in that the conductors are of the serigraphic type and in that they comprise two superimposed grids for the electric connection from the inside of the base-plate to the lateral walls of said grids, the upper grid being connected electrically to the lower part of the base-plate by first conducting portions situated on the edge of the housing, each disposed in a groove, and being extended by a tongue located under the base-plate to allow the electric connection of said grids, and the lower grid being electrically connected to the lower part of the base-plate by second conducting parts disposed in holes issuing onto the lower face of the base-plate, the second conducting parts being extended by a tongue located under the base-plate allow the electric connection of the grids, the holes and the grooves being staggered with respect to one another laterally by a half-pitch.

In embodiments where the housing carrier comprises folded over contacts this folding over can be realized about a substantially parallelepipedic outline made of insulating material in such a way as to mechanically protect the conductors during the handling and positioning of the base-plate by welding, and to give the assembly a certain elasticity allowing the absorbtion of thermal stresses.

In any case, the folding over can be realized for at least one of the rows about a substantially parallelepipedic outline made of insulating material and for at least another row after passage of the conductors in the openings provided in the said outline.

The outline can comprise lateral faces of which at least one bears grooves in which the conductors are guided upstream of their folded over ends. The outline can be constituted by an insulating element maintained in position by the connectors folded over about it.

The housing can be made of conducting material, and can comprise an intermediary plate disposed inside the housing and adapted to receive at least two rows of staggered insulating passages through which pass the said output conductors.

BRIEF DESCRIPTION OF THE DRAWINGS

The invention will be better understood by reading through the following description, given by way of non-limitative example, with reference to the annexed drawings in which:

FIG. 1 represents in perspective a housing carrier according to a first embodiment of the invention;

FIG. 2 represents in perspective a housing carrier according to another embodiment of the invention;

FIGS. 3a and 3b represent, respectively, a detail of FIG. 2 and the print of the conductors on the printed circuit on which the housing carrier must be welded;

FIG. 4 represents a variant of FIG. 1 in the case of a metallic housing;

FIGS. 5a and 5b represent, respectively, a detail in perspective of the output conductors of the housing of FIG. 5, and a connections block also in perspective;

FIGS. 6a, 6b and 6c represent respectively a variant of a block represented in FIG. 5b, and sections along AA and BB FIG. 6a;

FIGS. 7a and 7b each represent a ceramic sheet in crude state for the realization of a ceramic housing according to the invention and represented in section in FIGS. 8a and 8b;

FIG. 7c represents a sector of FIG. 7b;

FIG. 8c represent a view from below of a detail of the housing carrier of FIGS. 8a and 8b;

FIG. 8d represents a view from above of a sector presenting a serigraphy frame.

DETAILED DESCRIPTION

According to FIG. 1, a housing 1 provided with a cover 3 presents on its lateral face a row of connections 5 disposed along a given pitch and on each of the edges of its lower face a row of output conductors of the same pitch as the preceding one but staggered by a half pitch with respect to it. The end portions or parts of the output conductors 5 are folded over towards the inside of the housing, while the end portions or parts of the output conductors 9 are folded over towards the outside of the housing, so as to produce an interdigited structure.

On the printed circuit on which the housing carrier is fixed by welding, the prints are disposed in the same way as those of the housing carriers of the prior art but at a pitch that will be half the pitch previously used, which allows to multiply by two the number of output conductors of which disposes the base-plate, i.e. to dispose the output conductors at an effective pitch of 0.636 mm.

According to FIG. 2, two rows of output conductors 25 and 26 are disposed on each of the lateral faces of the housing 1. These rows are staggered. The end portions or parts of the output conductors 25 that constitute the upper rows are folded ower towards the outside of the housing, and the end portions or parts of the output conductors 26 that constitute the lower row are folded over towards the inside of the housing.

According to FIG. 3a, the tongues 25 present an end portion 27 folded over at 90° towards the outside of the housing after passage in an opening 30 of a connections block 26 while the output conductors 26 present an end portion presenting two curves at right angle, a first curve 28 adapted to form the contact per se and possibly a second curve 29 being folded over in a groove of the connections block 6. The prints on the printed circuit of which will be welded the base-plate are present in the form of two rows of pitches p staggered from one another by P/2.

According to FIG. 4, the housing 1, made of conducting material, is closed by a cover 3, also made of conducting material. Openings 2 are provided on the lower face of the housing and on the lateral face in such a way as to allow output conductors 9 and 5 to pass outside such as those represented on FIG. 1. An intermediary plate 4 receives an integrated circuit 7 connected by cable wires 8 to one end of conductors 9 and 5 located on the above face of the intermediary plate 4. The conductors 5 present from their connections end 10, a straight portion 11 allowing their passage through openings 2 that are sealed by the insulating passages, for example, of glass beads. At its exit from opening 2, the conductor 5 is folded over a first time perpendicularly in 12 so as to orient it towards the lower part of the housing then, after a straight portion 13 is bent, a further time about a connections block 6, the plane portion 14 folded over at 90° about the block 6 forming the active part of the output conductor that will be welded on a printed circuit. The end 15 of the output conductor 5 can be, furthermore, folded over about the edge of the connections block 6 opposite the plane section 13. As concerns the output conductor 9, it is folded over in 17 at 90° so as to allow its passage by an opening 2 of the lower face of the housing 1. It crosses through opening 2 on a rectilinear portion 18 then is thereafter folded over in 19 towards the outside of the housing in such a way that the rectilinear portion 20 forms an electric contact at the lower part of the connections block 6, the end 21 of the rectilinear portion 20 being able to be, furthermore, folded over about block 6 at the level of the edge opposite that which tangents the rectilinear portion 18. The block 6 made of insulating material is thus maintained mechanically in position by the two series of alternate contacts 5 and 9 that form an interdigitated structure and protects them at the same time against the mechanical as well as thermal stresses and shocks to which the housing can be subjected. The block 6 can be made of vitroceram or alumina. It is particularly advantageous that the block 6 be of plastic material so that the assembly formed by the block and the conductors is adapted to absorb any eventual thermal dilation differences between the housing and the substrate on which it is destined to be welded. A temperature holding plastic such as a polysulfone could be chosen.

It will be noted that the manufacture of this housing can be realized in a classical way, by operating a baking of the glass beads in openings 2 so as to produce the tightness of the housing. This baking is carried out prior to the folding over of the connections.

FIG. 5a shows a detail in perspective of the embodiment of FIG. 4 in which block 6 is represented in broken lines.

According to FIG. 5b, this block presents grooves 30 and 31 adapted to receive the rectilinear portions 13 and 18 of the output conductors 5 and 9. This embodiment allows an improved reciprocal maintenance of the block 6 and output conductors.

According to FIGS. 6a to 6c, the ends 15 and 21 of the output conductors 5 and 9 are introduced in the blind holes respectively 32 and 33 provided opposite grooves 30 and 31 at the lower face of the connections block 6.

According to FIG. 7a, a sheet 38 in crude ceramic material comprises a certain number of square sectors 39 the outline of which is defined by a large number of bores 40 equal to half or about half (here to half plus two) of a number of outputs of the housing, spaced apart from the pitch of the connections of each sector 39 comprising at its centre an opening 51'.

According to FIG. 7b, a crude ceramic material sheet 35 comprises a certain number of square sectors 36 the outline of which is defined by a first row outside bores 37 in number equal to half the number of the outputs of the housing and spaced from the pitch of the connections. Bore holes 37 are disposed according to a square having the same dimension as that formed by bore-holes 40. On a square having a smaller side, a second lower row of bore-holes 57 is disposed whose number is about equal to half the number of outputs of the housing and spaced from the pitch of the connections. The bore-holes 57 are staggered by a half pitch with respect to bore-holes 37. Each sector 36 comprises at its centre an opening 51'' smaller than opening 51'.

The upper faces of each sheet 38 and 35 are serigraphied in a classic manner so as to create a connection outline respectively 45 between the holes 40 and the opening 51 and 41 between the holes 57 and the opening 51''. The needles are in a manner known per se introduced into the openings 37, 40 and 57 to cause to penetrate therein the serigraphy paste and to cause it to deposit on the edges of the said openings. The sheets to be treated are, with this purpose, disposed in a manner known per se above a serigraphy paste reserve into which the needles are plunged. According to another known variant, the serigraphy paste is drawn through the serigraphy screen provided for this purpose, the holes of which are aligned with those to be metallized. Sheets 38 and 35 are there after superimposed in such a way as to cause to coincide sectors 39 and 36.

The sandwich is completed by superimposing, on the one hand, an upper sheet comprising square sections 49 each provided with a central opening 51, larger than opening 51', and presenting about said opening a serigraphied frame 61 allowing the subsequent welding of a carter, and on the other hand, a lower sheet bearing square sectors 62. Each of the square sectors 62 comprises an outside series of openings 63, and an inside series of openings 65 each disposed on the outline of a square of the same side as respectively those defined by bore-holes 37 and 57. The openings 63 and 65 are also metallized, so as to form metallizations, respectively 47' and 42', by the serigraphy paste, like openings 37, 57 and 40. On the other hand, the lower part of each section 62 comprises serigraphied metallizations 48 and 43, forming connecting tongues electrically connected to the metallizations of openings 63 and 65, repsectively.

After baking the ceramic material and splitting the blocks thus obtained along the cleaving lines constituted by superimposed bore-holes, housing carriers 50 are obtained such as represented in FIGS. 8a and 8b. It will be noted that on these figures, the separation lines between sectors 49, 39, 36 and 62 have been retained in order to facilitate understanding. In fact, given that the ceramic is baked, the whole forms a homogenous block.

According to FIGS. 8a and 8b, two rows of superimposed connections 45 and 41 are connected to the lower face of the housing carrier by metallization staggered by a half-pitch and disposed for some on the lateral faces of the housing carrier 50 and for the others in the internal openings. The first series of these connections 46, 47, 47' is disposed in a groove 37, 40 defined by the subsisting edges of the bore-holes 37, 40 and 63 after clearing. The second series of these connections 42, 42' is disposed in internal openings of the housing carrier and is formed by superimposing the openings 57 and 68.

Each connection of the lower row of the connections comprises a first rectilinear section 41 extending between the sectors 39 and 36 from a first end where it is destined to be connected to a component disposed at the bottom of the opening 51", this connection being facilitated by a zone 55 forming a gradient, i.e. the openings 51" are slightly larger than openings 51', up to the outside edge where it is electrically contacted to a second rectilinear section 42 disposed in a corresponding opening 57. This rectilinear section is extended by a third section 42' disposed in a corresponding opening 65, then by a tongue 43 extending on a small distance under the lower face 44 of the base-plate 50 with the purpose of welding it on a substrate. The sheet bearing the sectors 62 was, with this aim, serigraphied on its lower face as represented in FIG. 8c.

Each connection of the upper connections row comprises a first rectilinear section 45 extending between the sector 38 and the sector 49 from a first end where it is destined to be connected to a component disposed at the bottom of the opening 51', this connection being facilitated by a zone 56 forming gradient, i.e. the opening 51 of the sector 49 is slightly larger than the opening 51' of the sector 39, until an external ridge of the housing where it is electrically contacted to a second rectilinear section 46 disposed in one of grooves 40 obtained by the separation of the blocks realized after baking, these blocks being then broken along the length of the lines formed by openings 40. This second rectilinear section is extended with electric continuity by a third rectilinear section 47 disposed in the groove 37 located in the extension of the said groove 40, then by a fourth rectilinear section 47' disposed in the groove 63 located in the extension of the said groove 37, and ends, of course always in electric continuity, by a conducting tongue 48 which extends on a small distance under the lower face 44 of the base-plate 50, and is aimed to allow its on a substrate.

These figures represent tongues 43 directed towards the inside of the housing. The serigraphy tecnhique has a fineness sufficient for these tongues 43 to be directed towards the outside of the housing, in such a way as to be inter-digited with tongues 48. In this case, they extend preferentially to the edge of the housing in such a way as to allow visual inspection. Furthermore, in practice it will not be necessary to metallize the bore-holes 63 located in the angles of the housing carrier.

The ceramic material can be formed of 99% alumina to which has been added a binder, a dispersing agent and a deflocculating agent, as well as a mineralizator (Mg or Ca) to decrease the sintering temperature to 1500°–1600° C. The serigraphy ink can comprise (by weight) 100 parts tungsten, 2.5 parts nitrocellulose (binder), 12.5 parts butyl lactate (dispersant) and 0.5 parts metinaden oil (dispersing and deflocculating agent).

By way of example, the metallizations have thicknesses of from 10 to 20 microns, the metallization 70 is a square of 7.62 mm sides, as well as opening 51". The opening 51' is a square of 10 mm sides and opening 51 a square of 12.40 mm sides. The external dimensions of the housing are those necessitated by the positioning of the connections at a pitch of 1.27 mm for each row.

We claim:

1. A housing carrier for an integrated circuit, comprising:
    a housing made of conductive material having a bottom and a plurality of lateral sides connected to said bottom to form a box with an open top;
    passages formed in said lateral sides and said bottom, said passages being made of insulating material;
    a plurality of conductors, arranged in n (n≧2) rows, disposed at regular intervals according to a given pitch, said n rows being staggered with respect to one another by 1/n pitch; a first end of each conductor extending from said housing to allow an electrical connection to a utilization circuit, a second end of each conductor being connected to said integrated circuit; each conductor passing through one of said passages, with at least one row passing through said bottom and at least one row passing through said lateral sides;
    an insulating block adjacent to said housing;
    said first ends of said conductors being bent to extend around at least part of said insulating block so that all of said first ends extend across at least one surface of said insulating block in common.

2. A housing carrier according to claim 1, wherein at least one row is bent in a first direction and at least one row is bent in a second direction opposite said first direction.

3. A housing carrier according to claim 1, wherein said one surface of said insulating block contains depressions for receiving said first ends.

4. A housing carrier according to claim 1, further comprising a cover mounted on said lateral sides opposite said bottom to form a closed box.

5. A housing carrier according to claim 1, further comprising a plate for receiving said integrated circuit and said second ends and mounted on said bottom inside said housing.

* * * * *